US008621597B1

(12) United States Patent
Jenkins, IV

(10) Patent No.: US 8,621,597 B1
(45) Date of Patent: Dec. 31, 2013

(54) APPARATUS AND METHOD FOR AUTOMATIC SELF-ERASING OF PROGRAMMABLE LOGIC DEVICES

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 2142 days.

(21) Appl. No.: 10/971,409

(22) Filed: Oct. 22, 2004

(51) Int. Cl.
    *G06F 9/00* (2006.01)
    *G06F 15/16* (2006.01)
    *G06F 17/00* (2006.01)

(52) U.S. Cl.
    USPC .......................................................... 726/14

(58) Field of Classification Search
    USPC ........................................... 726/14; 711/163
    See application file for complete search history.

(56) References Cited

U.S. PATENT DOCUMENTS

| | | | |
|---|---|---|---|
| 5,933,498 A * | 8/1999 | Schneck et al. | 705/54 |
| 6,160,741 A * | 12/2000 | Ueyama et al. | 365/185.33 |
| 6,357,007 B1 * | 3/2002 | Cromer et al. | 713/194 |
| 6,429,682 B1 | 8/2002 | Schultz et al. | |
| 6,651,199 B1 | 11/2003 | Shokouhi | |
| 7,043,631 B2 * | 5/2006 | Baum et al. | 713/2 |
| 7,124,170 B1 * | 10/2006 | Sibert | 709/216 |
| 7,190,190 B1 * | 3/2007 | Camarota et al. | 326/38 |
| 2002/0124178 A1 * | 9/2002 | Kocher et al. | 713/193 |

OTHER PUBLICATIONS

Oct. 25, 2000 Yehuda Shiran, PhD, internet.com.*

* cited by examiner

*Primary Examiner* — Edan Orgad
*Assistant Examiner* — Harris Wang
(74) *Attorney, Agent, or Firm* — Samuel G. Campbell, III; Kevin T. Cuenot; LeRoy D. Maunu

(57) ABSTRACT

Programmable logic devices (PLDs), programmable logic arrays (PLAs), complex programmable logic devices (CPLDs), and field programmable gate arrays (FPGAs), (collectively referred to as "PLDs") can include circuitry for performing automatic erasing or "zeroization" of security information including data and programming. Such circuitry detects the occurrence of a possible security event, selects and/or forms one or more appropriate erase commands, and causes the command(s) to be executed against PLD memory. The circuitry prevents security information from being compromised under certain situations.

29 Claims, 4 Drawing Sheets

US 8,621,597 B1

APPARATUS AND METHOD FOR AUTOMATIC SELF-ERASING OF PROGRAMMABLE LOGIC DEVICES

TECHNICAL FIELD

The present invention relates to programmable logic devices (PLDs) and in particular to self-erasing capabilities within programmable logic devices.

BACKGROUND

Programmable logic devices (PLDs), programmable logic arrays (PLAs), complex programmable logic devices (CPLDs), and field programmable gate arrays (FPGAs), (collectively referred to herein as "PLDs") are well known devices that can be programmed by a user to implement user-defined logic functions. PLDs, as described and claimed in numerous patents assigned to Xilinx, Inc., assignee of the present invention, allow a user to configure and reconfigure the programmable elements on the PLD to implement various logic functions. Because of this versatility, the functionality implemented on a PLD can be updated as improvements in design and efficiency occur, without requiring new silicon. In general, a PLD can be reconfigured with an improved design, instead of designing a new device.

Numerous different configuration memory technologies are used with PLDs to provide programmability. In general, these technologies can be categorized as either volatile, where the memory loses its state information when power is removed from the circuit, or nonvolatile, where state information is retained in the circuit even when power is removed from the circuit. PLDs typically use some combination of the two to accomplish desired functions. One particularly useful class of nonvolatile memories are those that can be programmed multiple times, such as erasable programmable read-only memory (EPROM), electrically erasable programmable read-only memory (EEPROM), E$^2$CMOS™ memory, flash memory, and magnetoresistive RAM (MRAM).

FIGS. 1A-1B illustrate simplified diagrams of several different types of PLDs that make use of such re-programmable nonvolatile configuration memory. As shown in FIG. 1A, PLD 100 includes device logic 105, e.g., various programmable logic blocks, interconnect blocks, and I/O blocks, and associated volatile configuration memory 110. Volatile configuration memory 110 is typically implemented as static random access memory (SRAM), and provides storage of the configuration data used to define the device functionality. SRAM is essentially infinitely re-configurable, but since it loses its programming once power has been removed from the device it requires some non-volatile memory source for the configuration data. In some implementations (not shown), traditional ROMs or programmable ROMs (PROMs) are used off-chip for this purpose. However, PLD 100 provides nonvolatile configuration memory 125 that eliminates the need for external configuration devices. When included in a device like PLD 100, nonvolatile configuration memory 125 more permanent, and in some cases re-programmable, storage for configuration information.

On device startup, configuration data is loaded into volatile configuration memory 110 from nonvolatile configuration memory 125. Interfaces are typically available in PLD 100 to access one or both of the memories. In this example, JTAG interface 120 is used by external devices and by device logic 105 to program nonvolatile configuration memory 125. An additional interface 115 (typically implemented as a serial or parallel data interface) provides direct I/O access to volatile memory 110.

FIG. 1B illustrates an alternate arrangement where the nonvolatile configuration memory is external to the PLD. Thus, PLD 150 includes device logic 155, volatile configuration memory 160, JTAG interface 170, and serial/parallel interface 165. Nonvolatile configuration memory 175 is on a separate integrated circuit, and includes its own JTAG interface 190, memory circuit 185 (implementing some type of nonvolatile memory), and serial/parallel interface 180. Examples of devices such as nonvolatile configuration memory 175 are described, for example, in U.S. Pat. No. 6,651,199, entitled "In-System Programmable Flash Memory Device with Trigger Circuit for Generating Limited Duration Program Instruction," naming Farshid Shokouhi as the inventor, which is hereby incorporated by reference herein in its entirety. When PLD 150 starts up, configuration data is loaded into volatile configuration memory 160 from nonvolatile configuration memory 175.

The primary advantage of using nonvolatile configuration memory can be a significant disadvantage in some implementations where secure information is to be stored on the PLD. Secure information can include, for example, device programming providing security functions (e.g., encryption, hashing, one-way algorithms, pseudo-random number generation); security-related parameters (e.g., secret and private cryptographic keys, and authentication data such as passwords and PINs) whose disclosure or modification can compromise the security of a cryptographic module; and private data (test data, personal information, etc.). When such secure information is stored in nonvolatile memory, it is more likely that the information can be comprised when the device itself is compromised or vulnerable.

Moreover, various standards for the security requirements of cryptographic modules, including, for example, the FIPS PUB 140-2, *Security Requirements for Cryptographic Modules*, as promulgated by the National Institute of Standards and Technology (NIST), require that devices possess some sort of zeroization capability. Zeroization is generally defined by NIST as a method of erasing electronically stored data, cryptographic keys, and cryptographic security parameters by altering or deleting the contents of the data storage to prevent recovery of the data.

Accordingly, it is desirable to have PLD architectures and usage methods that allow for safeguarding of security information when it is retained in nonvolatile, but typically reprogrammable, memory.

SUMMARY

In some embodiments of the present invention, programmable logic devices (PLDs), programmable logic arrays (PLAs), complex programmable logic devices (CPLDs), and field programmable gate arrays (FPGAs), (collectively referred to as "PLDs") can include circuitry for performing automatic erasing or "zeroization" of security information including data and programming. Such circuitry detects the occurrence of a possible security event, selects and/or forms one or more appropriate erase commands, and causes the command(s) to be executed against PLD memory. The circuitry prevents security information from being compromised under certain situations.

Accordingly, one aspect of the present invention provides a circuit comprising a security event detection circuit and an erase controller coupled to the security event detection circuit. The security event detection circuit is configured to receive a signal from at least one of an external pin and a logic block. The signal indicates the possible occurrence of an event that can compromise circuit security. The erase controller is configured to form at least one configuration memory erase command and transmit the at least one configuration memory erase command to a programming interface.

Another aspect of the present invention provides a method. Occurrence of a security event is detected. At least one configuration memory erase command is prepared. The at least one configuration memory erase command targets a portion of a configuration memory. The at least one configuration memory erase command is transmitted to a programming interface.

Another aspect of the present invention provides an apparatus including: a means for detecting occurrence of a security event; a means for preparing at least one configuration memory erase command targeting a portion of a configuration memory; and a means for transmitting the at least one configuration memory erase command to a programming interface.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

Figure 2:
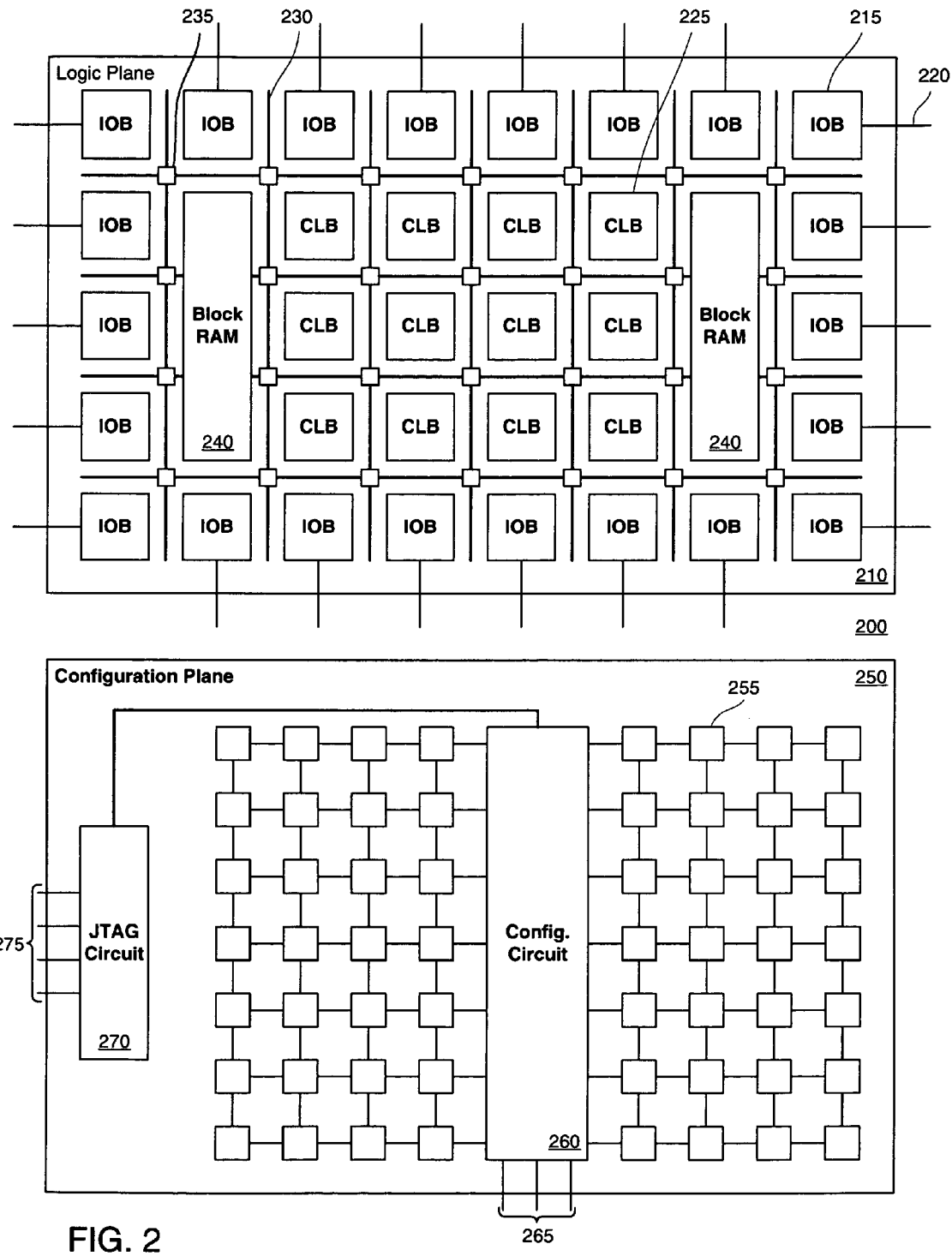
FIG. 2 is a simplified diagram illustrating a programmable logic device in accordance with one implementation of the present invention.

FIG. 2 is a simplified diagram illustrating a particular PLD, e.g., an FPGA, that implements some of the devices and techniques of the present invention. Like many PLDs, PLD 200 includes programmable circuitry formed on a semiconductor substrate that is housed in a package having externally accessible pins. To simplify the following description, PLD 200 is shown using a split-level perspective where it is functionally separated into logic plane 210 and configuration plane 250. In actual implementation, the circuitry of PLD 210 may not be physically separated into logic and configuration planes as illustrated in FIG. 2. Other simplifications and functional representations are utilized to facilitate the following description.

Programmable logic plane 210 includes a plurality of input/output blocks (IOBs) 215 for providing the interface between package pins and internal signal lines, a plurality of configurable logic blocks (CLBs) 225 for configuring the desired programmable logic, and a programmable interconnect 230 for interconnecting the input and output terminals of these blocks. A plurality, of switch matrices 235 selectively connect the horizontal and vertical lines of programmable interconnect 230, thereby allowing full connectivity between any two elements of PLD 200. IOBs 215, CLBs 225, programmable interconnect 230, and switch matrices 235 are customized by programming internal memory cells (255) using a software-generated, configuration bitstream. The values stored in these internal memory cells determine the logic function(s) implemented by PLD 200.

In one embodiment, CLBs 225 are arranged in rows and columns, IOBs 215 surround the CLBS, and programmable interconnect 230 and switch matrices 235 are connected between the rows and columns of CLBs and IOBs. During normal operation of PLD 200, logic signals are transmitted through device I/O pins 220, through the IOBs to the interconnect resources, which route these signals to the CLBs in accordance with the configuration data stored in configuration memory. The CLBs perform logic operations on these signals in accordance with the configuration data, and transmit the results of these logic operations to other CLBs and/or IOBs. Additionally, logic plane 210 includes dedicated random-access memory blocks (block RAM) 240 that are selectively accessed through the IOBs and interconnect resources. Other programmable logic plane resources, such as clock resources, are omitted from FIG. 2 for brevity.

Figure 1A:
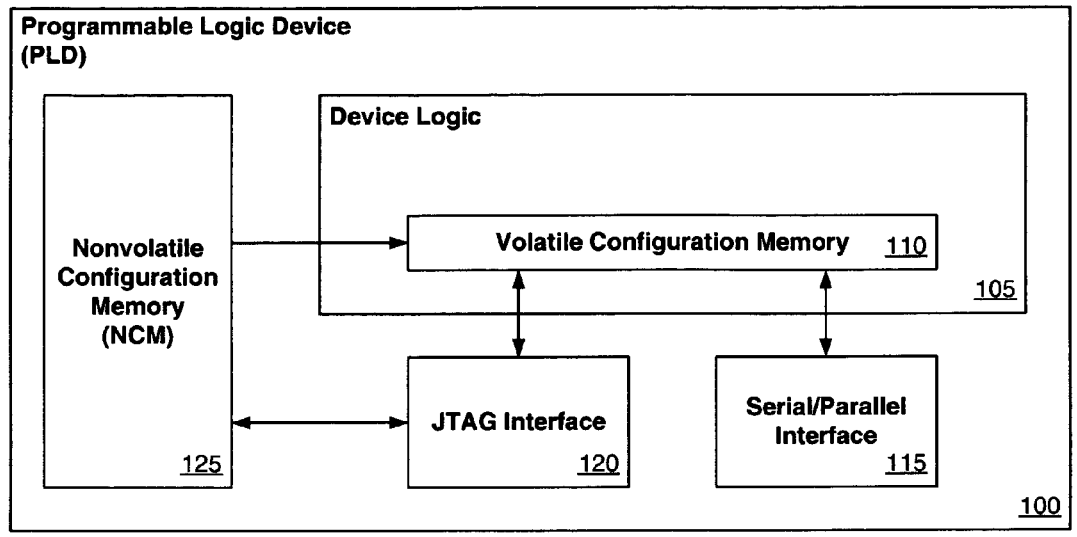
FIGS. 1A-1B illustrate simplified diagrams of several different types of prior art programmable logic devices using nonvolatile configuration memory.
Figure 1B:
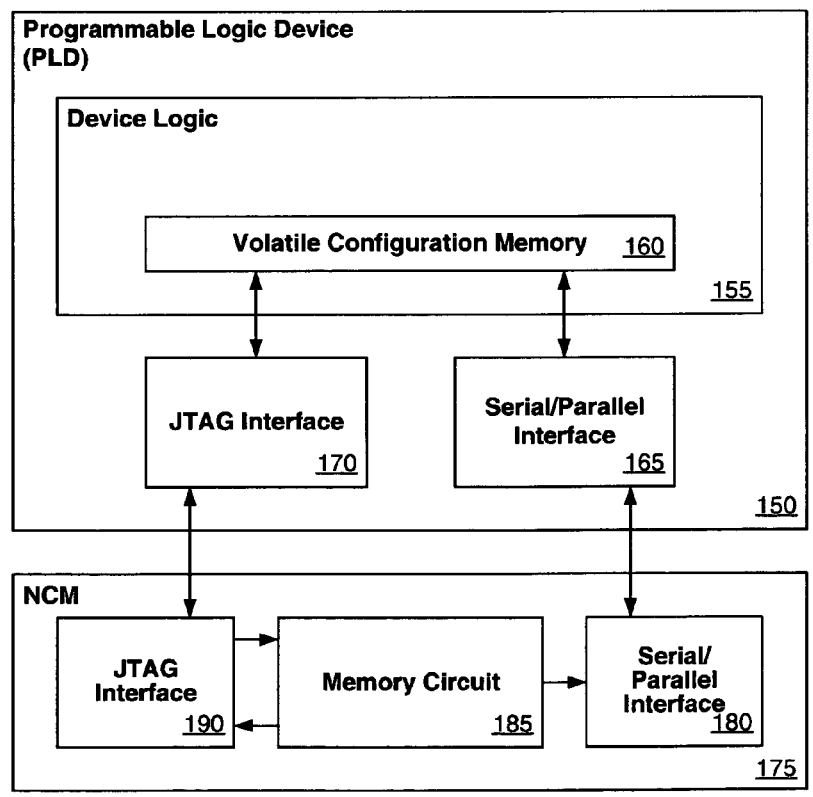

Configuration plane 250 generally includes a configuration circuit 260 and configuration memory array 255. Configuration circuit 260 typically includes several input and/or output terminals that are connected to dedicated configuration pins 265 and to dual-purpose I/O associated with IOBs, e.g., I/O pins 220 (connection not shown). Configuration memory array 255 includes memory cells that can be arranged in "frames" (i.e., columns of memory cells extending the length of PLD 200), and addressing circuitry (not shown) for accessing each frame. Configuration memory array 255 is typically formed from some combination of volatile configuration memory (e.g., SRAM) and nonvolatile memory (e.g., flash memory). As described above in the context of FIGS. 1A-1B, the nonvolatile configuration memory may or may not be located on the same integrated circuit die as the device logic and volatile configuration memory. Thus, configuration memory array 255 is merely illustrative of the types of configuration memory used by PLD 200. In general, the nonvolatile configuration memory included in or used with PLD 200 is of a variety that can be re-programmed one or more times.

JTAG circuitry 270 is included in configuration plane 250, and is also connected to at least one terminal of configuration circuit 260. JTAG circuit 270 includes four known (and required) JTAG terminals 275, i.e., TDI (data in), TDO (data out), TMS (mode select), and TCK (clock). During configuration of PLD 200, configuration control signals can be transmitted from dedicated configuration pins 265 to configuration circuit 260. Additionally, a configuration bit stream can be transmitted from either the TDI terminal of JTAG circuit 270, or from IOB I/O pins, such as 220, to configuration circuit 260. During a configuration operation, circuit 260 routes configuration data from the bit stream to memory array 255 to establish an operating state of PLD 200.

A configuration circuit such as circuit 260 typically includes a configuration bus structure and a collection of configuration registers for accessing and controlling the configuration logic of configuration plane 250. Such configuration registers are accessed through JTAG circuit 270 and/or some other general purpose interface circuit (not shown). The configuration registers can include command registers, control registers, mask registers, configuration options registers, cyclic redundancy check (CRC) registers, status registers, and the like. Circuit 260 typically implements a configuration state machine to coordinate the configuration registers and memory array 255 during configuration and read back operations. Examples of such configuration circuits and their operation with JTAG circuits can be found, for example, in U.S. Pat. No. 6,429,682, entitled "Configuration Bus Interface Circuit for FPGAs," naming David P. Schultz et al., as inventors, which is hereby incorporated by reference herein in its entirety. Numerous other configuration circuits can be implemented in PLD 200. Moreover, more simplified designs can use I/O interface circuits like JTAG circuit 270 to perform configuration functions.

Many of the examples illustrated in the present application describe the use of so-called JTAG interfaces and JTAG circuits through which a user can program the device. This interface is a standard specified in "IEEE Standard Test Access Port and Boundary-Scan Architecture", IEEE Std 1149.1-2001, published by the Institute of Electrical and Electronics Engineers, Inc. Jun. 14, 2001. The JTAG standard specifies common boundary-scan technology, enabling engineers to perform extensive debugging and diagnostics on a device through a small number of dedicated test pins. Signals are scanned into and out of the I/O cells of a device serially to control its inputs and test the outputs under various conditions. IEEE 1149.1 compliant interfaces and circuits are also routinely used in PLDs to provide a programming interface.

A related IEEE standard is "IEEE Standard for In-System Configuration of Programmable Devices", IEEE Std 1532-2002, published by the Institute of Electrical and Electronics Engineers, Inc. Dec. 1, 2002. IEEE 1532 defines extensions to IEEE 1432.1 providing a methodology for implementing programming capabilities within programmable ICs utilizing and compatible with the IEEE 1149.1 communication protocol. Compliant devices can use the 1532 interface for programming (write operations), read-back operations, erasing, and verification operations. IEEE 1532 is designed specifically to configure, reconfigure, verify, and erase PLDs either before or after they have been installed on a board.

Although much of the discussion in the present application will focus on IEEE 1432.1 and 1532 compliant devices, those having ordinary skill in the art will realize that numerous different interfaces can be used to accomplish the in-circuit erasing operations described herein. Other such examples include conventional serial and parallel I/O interfaces, proprietary interfaces, and other standard interfaces such as the STAPL (Standard Test and Programming Language) standard as promulgated by JEDEC. In general, any programming interface used by a PLD can be employed by the devices and techniques of the present invention.

In the case of a conventional JTAG (IEEE 1432.1) implementation, a JTAG instruction register circuit (i.e., an instruction register and instruction decoder) shifts instruction data and an internal state machine (the test access port (TAP) controller) is used to control the programming states and timing. Generally, JTAG-based systems issue a general program instruction (INSTN), which then initiates a JTAG RUN-TEST signal. When both INSTN and RUN-TEST signals are asserted, the TAP controller begins a program state (or similarly the erase, blank check or program verify states), and programming of the configuration memory is ultimately initiated. When programming is finished, the TAP controller goes into a discharge state where the logic high voltage signals INSTN and RUN-TEST are discharged, followed by returning to an idle state. Typically, the programming state lasts approximately 5 msec, and the discharge state lasts approximately 18 μsec.

Examples of JTAG implementations can be found in the aforementioned U.S. Pat. No. 6,651,199. The various components of JTAG circuit 270 operate according to well-known JTAG protocols. Three input connections for receiving the test clock input (TCK) signal, the test mode select (TMS) signal, and the test data input (TDI) signal are provided (275). The TMS signal is used to control the state of TAP controller (not shown) within circuit 270. The TDI signal is used for serial transmission of data or instruction bits, depending upon the state of the TAP controller. In addition to the above-mentioned input connections, an output connection is included through which TDO signals are transmitted. Depending upon the state of the TAP controller, the TDO signal is used to serially shift either instruction register or data register contents out of JTAG circuit 270.

Figure 3:
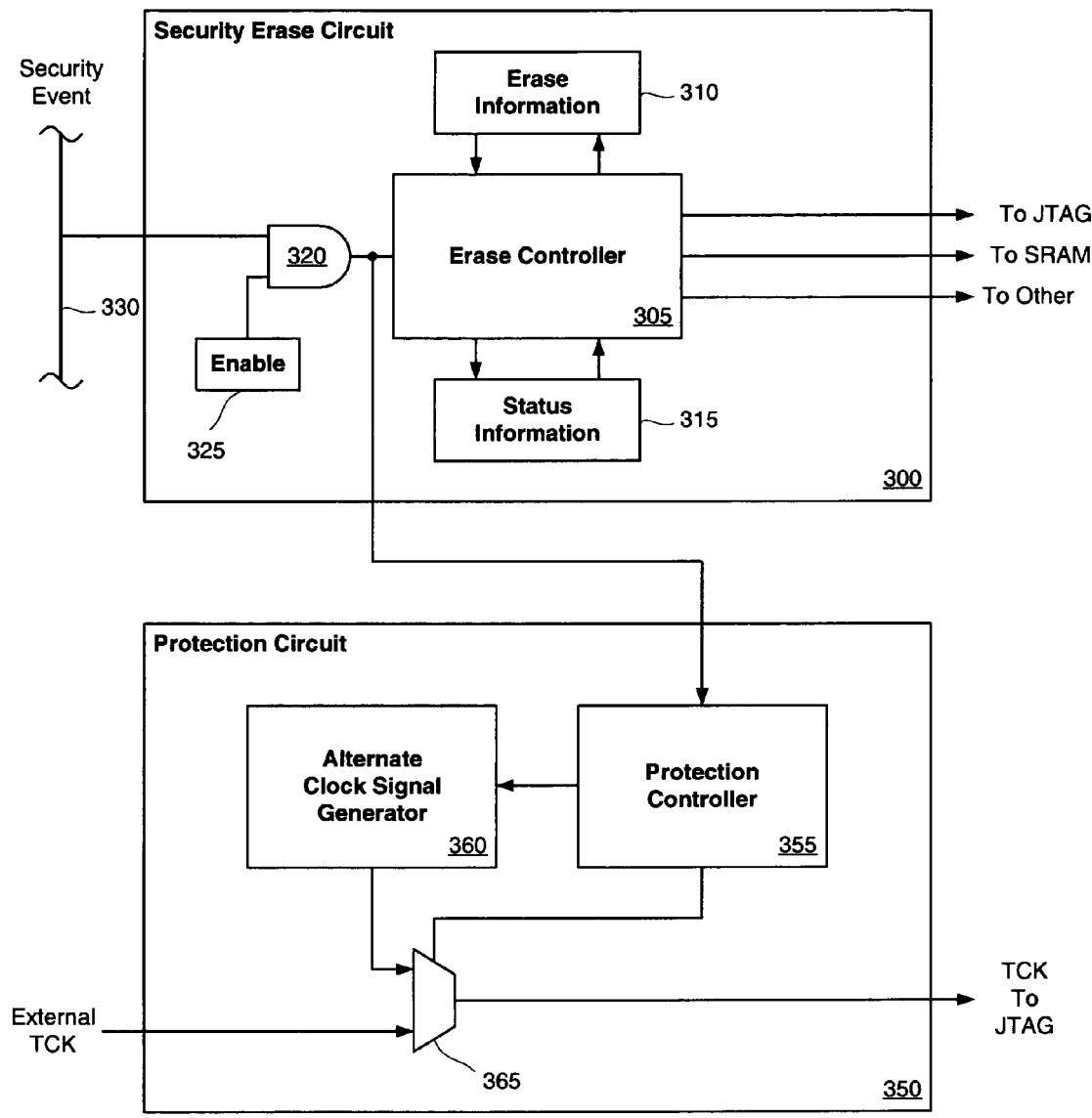
FIG. 3 illustrates circuitry used for device erase and protection operations in accordance with one implementation of the present invention.

Thus, JTAG circuit 270 can be used by a security erase circuit to selectively erase some or all of the nonvolatile and volatile configuration memory used with and/or included in PLD 200. FIG. 3 illustrates an example of such circuitry used for device erase and protection operations.

Security erase circuit 300 provides basic functionality for automatically erasing some or all of PLDs associated nonvolatile and volatile configuration memory upon detection of a security event. Security erase circuit 300 can also be configured to erase memory that is not strictly used for configuration purposes, e.g., block RAM 240. It can also include and/or initiate specialized circuits designed to protect device I/O interfaces while erase operations are performed.

Security erase circuit 300 includes erase controller 305, erase information memory 310, status information memory 315, enable logic 320 and enable memory 325. Security erase circuit 300 is typically implemented using one or more PLD blocks such as CLB 225 and IOB 215, but can also be implemented using specialized logic blocks in a PLD. Security erase circuit 300 is coupled to security event line 330 which provides an indication of the occurrence of a designated event that necessitates memory erase. Security event line 330 routes an appropriate control signal to security erase circuit 300 from one or more sources such as, an external PLD pin, other logic within the PLD for determining if a security event has occurred, and the like.

For example, where the PLD including security erase circuit 300 is used in a device subject to routine maintenance or servicing, e.g., a gaming machine or an ATM, opening the device enclosure might compromise PLD security. In that case, opening the device enclosure can trigger a signal supplied to a PLD pin which either directly or indirectly provides a security event signal on security event line 330. In another example, logic included in the PLD having security erase circuit 300, e.g., specialized logic or CLBs/IOBs configured to perform the function, can monitor for certain events and determine whether to issue a security event signal. Such monitoring might include: determining expiration of a timeout period, detection of various hacking attempts, security information expiration, error conditions that might compromise PLD security, receipt of external trusted "erase" commands, and the like. Numerous other conditions leading to the assertion of a security event signal will be well known to those having ordinary skill in the art.

Security erase circuit 300 is enabled, for example, using enable memory 325. In one example, memory 325 simply provides an enable bit to indicate whether the erase function is enabled. Enable memory 325 can be implemented using a simple state device, a volatile memory, a nonvolatile memory, or some combination thereof. Enable memory 325 can be implemented to retain its information subsequent to an erase operation initiated by security erase circuit 300, or it can be reset itself (typically as one of the final operations) by erase controller 305. AND gate 320 determines whether to activate erase controller 305 based on enable information from enable memory 325 and security event line 330.

If a security event has occurred and the erase capability is enabled, erase controller 305 is activated. Erase controller 305 forms the necessary erase commands for various portions of the PLDs configuration and/or working memory. The erase commands generated by erase controller 305 will typically depend on the type of interface used by the command (e.g., JTAG, serial, parallel, SRAM memory controller, etc.) and the portion of memory targeted. Consequently, erase information 310 can include information such as target memory addresses, erase priority, command structure, etc. for use by erase controller 305.

In some embodiments, only certain portions of the memory associated with the PLD are targeted for erasure. These might include memory locations storing cryptographic information, passwords, etc. In other embodiments, configuration memory storing programmable logic configuration information is targeted. In still other embodiments, all configuration information is targeted. Since the goal of circuit erasing is to prevent sensitive information from being compromised, it will be desirable in some instances to effect the erasing operation as quickly as possible. To that end, there can be prioritization of memory erase to ensure that the most critical portions of memory are erased first, while less critical portions are subsequently erased, and so on. Erase controller 305 may prepare and forward erase commands for multiple interfaces. For example, erase controller 305 can generate erase commands for nonvolatile configuration memory and forward those commands to a JTAG circuit, while at the same time generating and forwarding erase commands for configuration SRAM or working RAM. In general, erase controller 305 is configured to generate and issue erase commands for whatever interfaces are desired.

Erase commands will typically include some type of command instruction, and some address or memory location information. In some implementations, the commands issued by erase controller 305 are specific write commands designed to write a designated pattern into memory (e.g., all zeros, all ones, some random pattern) in order to make sure that security information cannot be compromised. Thus, these commands may not be erase commands explicitly, but by virtue of rendering the target security information useless, they effectively erase the security information and perform the desired zeroization. In some instances, multiple erase/write commands can target the same memory region to further ensure security information is destroyed. Although the examples described herein focus on PLDs making use of reprogrammable nonvolatile configuration memory, these devices and techniques can be used with one-time programmable configuration memory. For example, where the configuration memory includes antifuse technology and sufficient programming current is available, erase controller 305 can issue commands to the appropriate programming interface to cause all the antifuses in the memory (or a designated portion of the memory) to be blown, thereby rendering useless the information encoded in the memory. In some embodiments Erase controller 305 forwards the commands to the appropriate interface circuitry, e.g., JTAG circuit 275, configuration circuit 260, etc., as needed.

Security erase circuit 300 also includes status information memory 315. Status information memory 315 is used to store information about the erase operation. In the simplest case, status information memory 315 includes a flag indicating that for some reason, erase controller 305 has issued one or more erase commands. This status information can be useful for debugging purposes or to subsequently determine why certain memory has been erased. Status information memory 315 can include more detailed information such as the addresses of memory subject to erase commands, timing information, copies of actual commands used, and the like.

The occurrence of a security event can also cause security erase circuit 300 to activate other protection circuitry, such as protection circuit 350. In the example illustrated, protection circuit 350 is configured to prevent certain types of tampering with a JTAG circuit. For example, the TAP controller of a JTAG circuit can, in principle, be seized or rendered useless if the clock signal it receives from an external pin (TCK) is driven in a particular manner. If that occurs, erase commands send to the JTAG circuit might not be executed. Consequently, the same output of logic 320 also activates protection controller 355. Protection controller 355 activates an alternate clock signal generator 360 (e.g., a gated ring oscillator), and causes mux 365 to forward the clock signal generated by alternate clock signal generator 360 (instead of the externally supplied TCK) to the JTAG circuit. In this manner, the JTAG circuit is protected from external tampering via the TCK signal. In one embodiment, operation of erase controller 305 is delayed sufficiently to allow protection circuit 350 adequate time to take control of TCK.

Other interface protection circuits can be similarly implemented and triggered by security erase circuit 300 or separately activated using security event line 330. Still other protection circuitry, e.g., disabling certain types of access, setting the PLD into certain operation modes, etc., can be implemented. Although security erase circuit 300 and protection circuit 350 are shown as separate circuits, they can be integrated together (in whole or in part) as will be well known to those having ordinary skill in the art.

Figure 4:
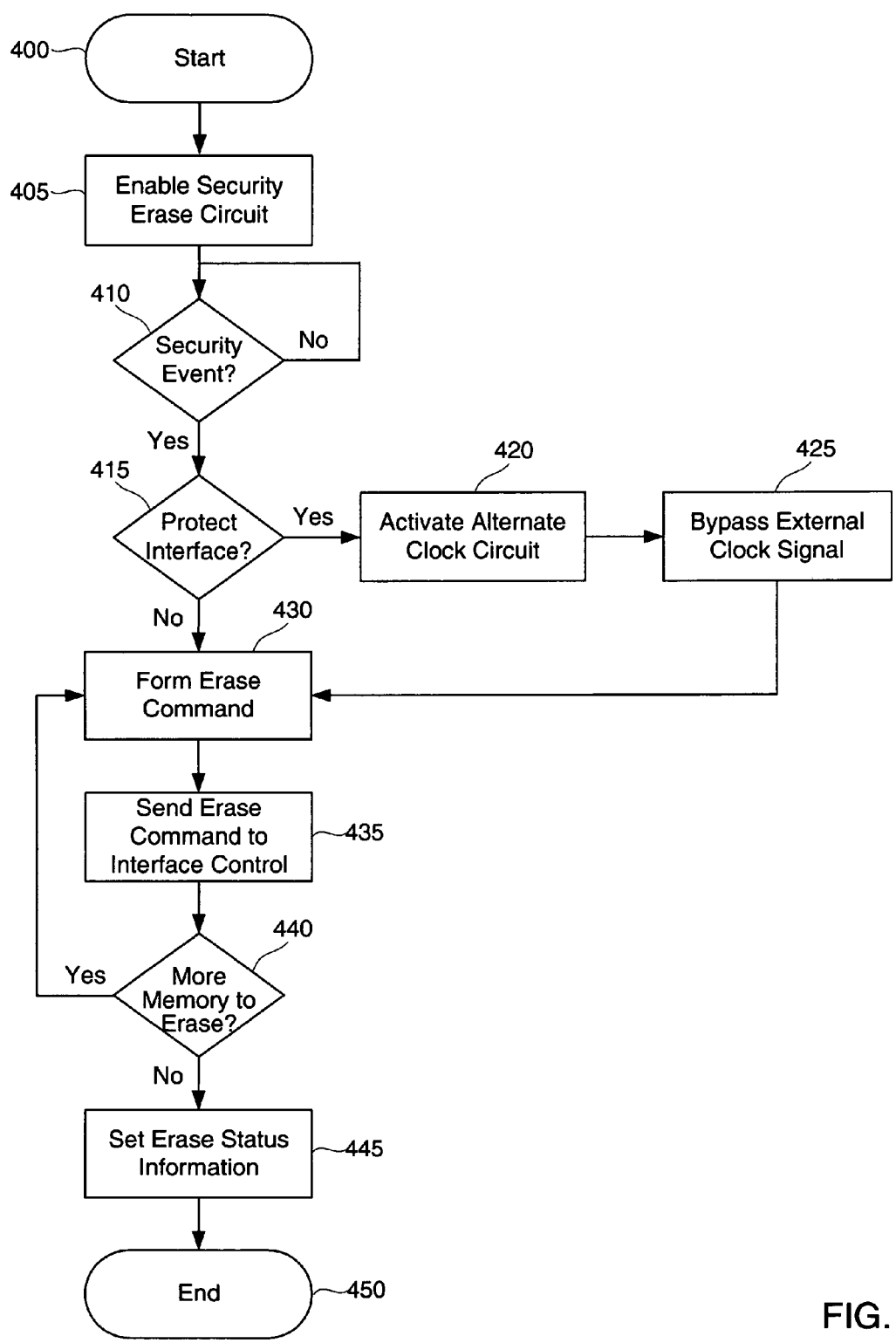
FIG. 4 is a simplified flow diagram illustrating some techniques of the present invention.

FIG. 4 is a simplified flow diagram illustrating some techniques of the present invention, including use and operation of devices such as those described in FIG. 3. Operation begins at 400 where the corresponding PLD is functioning normally or at least configured for normal operation. Next in 405, a security erase circuit is enabled. In the simplest example, this operation can include the setting of an enable bit in corresponding circuitry. Enabling the security erase circuit may also include loading requisite erase information such as, memory address information, priority information, erase/write command information, or other circuit configuration information. Once security erase features are enabled, the PLD operates as normal while some designated portion of the PLD monitors for the occurrence of a security event (410).

If a security event has occurred as determined in 410, a determination is made in 415 whether there is a need to protect other circuitry such as programming interfaces. In general, this can be an optional operation. In some implementations, additional protection circuitry is used automatically, and so no formal determination is made. In still other embodiments, some assessment is made about the nature of the security event to determine if protection is warranted. The example of FIG. 4 illustrates the use of a protection circuit like 350. When there is a need to protect a programming interface as determined in 415, operation transitions to 420 where actions are taken to protect the interface. Here, an alternate clock signal generator is activated. In some embodiments, such alternative circuitry is always operational and there is no need for an explicit activation step as illustrated. Once activated, the alternate clock signal is used to bypass the external clock signal being provided to the PLD (425). Other protective steps can be implemented as will be known to those having skill in the art.

Once the protective operations have been completed, or in the event that there is no separate protective steps to be taken (415), one or more erase commands are formed as shown in 430. As noted above, erase commands can be explicitly defined by the I/O protocol/interface in use. Moreover, erase commands may simply include one or more write commands that write specified values or bit patterns into the target memory. Such erase commands can target volatile and nonvolatile memory, as well as memory used for configuration purposes or for normal device operation purposes (e.g., storing computation results, storing temporary data, etc.), so-called "block memory". Next, the erase command is transmitted to control circuitry for the appropriate I/O interface (435). If there is additional memory to erase, as determined in 440, operation returns to 430 for further generation and transmission of erase commands.

If there is no further memory to erase, erase status information is set 445. This information typically indicates that some security related erasing has been performed. Moreover, it can include further details about the erase operation and status. In some implementations, status information can be set before or during one or more of steps 430-440. Once step 445 is complete, the process ends (450). Subsequent use of the effected PLD will typically require some re-initialization and/or reprogramming of the security information erased in the process.

The flow chart of FIG. 4 illustrates some of the many operational examples of the security event driven PLD memory erasing devices and techniques disclosed in the present application. Those having ordinary skill in the art will readily recognize that certain steps or operations illustrated in FIG. 4 can be eliminated or taken in an alternate order. Moreover, the methods described in FIG. 4 are typically implemented as circuits specially designed to perform these tasks; programmable circuits specially configured to perform these tasks; and/or one or more software programs encoded in a computer readable medium as instructions executable on a processor/controller/PLD. The computer readable medium can be any one of an electronic storage medium, a magnetic storage medium, an optical storage medium, and a communications medium conveying signals encoding the instructions. Separate instances of these programs can be executed on separate devices in keeping with the methods described above. Thus, although certain steps have been described as being performed by certain devices, software programs, processes, or entities, this need not be the case and a variety of alternative implementations will be understood by those having ordinary skill in the art.

Additionally, while the disclosed devices and techniques have been described in light of the embodiments discussed above, one skilled in the art will also recognize that certain substitutions may be easily made in the circuits without departing from the teachings of this disclosure. For example, a variety of logic gate structures may be substituted for those shown, and still preserve the operation of the circuit, in accordance with DeMorgan's law.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

Although the present invention has been described with respect to a specific preferred embodiment thereof, various changes and modifications may be suggested to one skilled in the art and it is intended that the present invention encompass such changes and modifications that fall within the scope of the appended claims.

The invention claimed is:

1. A programmable device comprising:
a security event detection circuit receiving a signal from at least one of an external pin and a logic block, the signal indicating possible occurrence of an event that can compromise circuit security;
an erase controller coupled to the security event detection circuit, wherein the erase controller forms at least one configuration memory erase command and transmits the at least one configuration memory erase command to a programming interface responsive to a detected security event;
wherein the programming interface circuit is coupled to the erase controller, wherein the programming interface circuit erases at least a portion of a configuration memory that programs the programmable device responsive to receiving, and according to, the at least one configuration memory erase command; and
a status information memory, coupled to the erase controller that is distinct from the configuration memory, storing status information comprising a record of memory addresses of the configuration memory subject to erasure as specified by each configuration memory erase command formed by the erase controller and transmitted to the programming interface, wherein the record of memory addresses is retained subsequent to erasure of the at least a portion of the configuration memory;
an erase information memory coupled to the erase controller, wherein the erase information memory is preloaded with a list of memory addresses to be erased responsive to the security event and the erase information memory further stores priority information indicating an order in which the addresses in the list of memory address are to be erased by the erase controller according to criticality of information stored in the configuration.

2. The programmable device of claim 1 further comprising:
a configuration memory.

3. The programmable device of claim 2 wherein the configuration memory comprises security information stored in the configuration memory.

4. The programmable device of claim 2 wherein the configuration memory includes at least one of a nonvolatile configuration memory and a volatile configuration memory.

5. The programmable device of claim 4 wherein the nonvolatile configuration memory includes at least one of an erasable programmable read-only memory (EPROM), electrically erasable programmable read-only memory (EEPROM), E2CMOS memory, flash memory, or magnetoresistive random-access memory (MRAM).

6. The programmable device of claim 4 wherein the volatile configuration memory further comprises static random-access memory (SRAM).

7. The programmable device of claim 1 wherein the erase controller is further configured to form at least one block memory erase command and transmit the at least one block memory erase command to a memory interface.

8. The programmable device of claim 1 further comprising:
a configuration memory;
a plurality of configurable logic circuits for performing corresponding logic functions in accordance with configuration data stored in the configuration memory; and
a programmable interconnect coupled to the plurality of configurable logic circuits and the configuration memory.

9. The programmable device of claim 8 wherein at least one of the plurality of configurable logic circuits is configured to provide at least one of the security event detection circuit and the erase controller.

10. The programmable device of claim 1 further comprising:
a security event line coupled between the at least one of an external pin and a logic block and the security event detection circuit.

11. The programmable device of claim 1, wherein the erase controller generates memory erase commands to erase each memory address in the list of memory addresses.

12. The programmable device of claim 1 wherein the status information stored in the status information memory comprises a copy of the configuration memory erase command transmitted to the programming interface circuit.

13. The programmable device of claim 1 further comprising:
a programming interface protection circuit comprising an alternative clock signal generator generating an alternative clock signal and a protection controller coupled to the erase controller.

14. The programmable device of claim 13 wherein the protection controller replaces a first clock signal, generated external to the programmable device, provided to the programming interface circuit with a second clock signal generated by the alternative clock generator within the programmable device responsive to the detected security event.

15. The programmable device of claim 1 wherein the at least one configuration memory erase command further comprises a memory write command.

16. A method performed within a programmable device comprising:
detecting an occurrence of a security event;
responsive to detecting the security event, preparing at least one configuration memory erase command specifying a portion of a configuration memory;
transmitting the at least one configuration memory erase command to a programming interface;
responsive to receiving the at least one configuration memory erase command, erasing the specified portion the configuration memory that programs the programmable device according to the at least one configuration memory erase command;
storing, within a status information memory that is distinct from the configuration memory, status information comprising a record of memory addresses of the configuration memory subject to erasure as specified by each configuration memory erase command prepared and transmitted to the programming interface, wherein the record of memory addresses is retained subsequent to erasure of the at least a portion of the configuration memory; and
storing erase information in a memory, the erase information including a list of configuration memory addresses to be erased and a priority order in which the addresses in the list are to be erased according to criticality of information stored in the configuration memory.

17. The method of claim 16 further comprising:
preparing at least one block memory erase command targeting a portion of a block memory; and
transmitting the at least one block memory erase command to at least one of the programming interface and a memory interface.

18. The method of claim 17 further comprising:
erasing data in the block memory using the at least one block memory erase command.

19. The method of claim 16 further comprising:
writing data over existing data in a configuration memory using the at least one configuration memory erase command.

20. The method of claim 16 wherein the detecting occurrence of a security event further comprises receiving a security event signal.

21. The method of claim 16 wherein the at least one configuration memory erase command is for one of a JTAG circuit, a serial input/output (I/O) circuit, or a parallel I/O circuit.

22. The method of claim 16 further comprising:
storing, as part of the status information within the status information memory, a copy of the configuration memory erase command received by the programming interface circuit.

23. The method of claim 16 further comprising:
replacing a first clock signal, generated external to the programmable device, provided to a programming interface of the programmable device with a second clock signal generated within the programmable device responsive to the detected security event.

24. A programmable device comprising
a means for detecting an occurrence of a security event;
a means for preparing at least one configuration memory erase command specifying a portion of a configuration memory responsive to detecting the security event, wherein the means for preparing the at least one configuration memory erase command is operable responsive to the security event;
a means for transmitting the at least one configuration memory erase command to a programming interface;
a means for erasing the specified portion of the configuration memory that programs the programmable device responsive to receiving, and according to, the at least one configuration memory erase command;
a means for storing status information comprising a record of memory addresses of the configuration memory subject to erasure as specified by each configuration memory erase command prepared and transmitted to the programming interface, wherein the record of memory addresses is retained subsequent to erasure of the at least a portion of the configuration memory; and
means for storing erase information in a memory, the erase information including a list of configuration memory addresses to be erased and a priority order in which the addresses in the list are to be erased according to criticality of information stored in the configuration.

25. The programmable device of claim 24 wherein the status information stored by the means for storing status information further comprises a copy of the configuration memory erase command received by the means for erasing the specified portion of the configuration memory.

26. The programmable device of claim 24 further comprising:
   a means for replacing a first clock signal, generated external to the programmable device, provided to the means for erasing the specified portion of the configuration memory with a second clock signal generated within the programmable device.

27. The programmable device of claim 1, wherein the status information memory further stores timing information of memory erase commands transmitted to the programming interface.

28. The method of claim 16, further comprising storing, within the status information memory, timing information of memory erase commands transmitted to the programming interface.

29. The programmable device of claim 24, wherein the means for storing status information further comprise means for storing timing information of memory erase commands transmitted to the programming interface.

\* \* \* \* \*